(12) United States Patent
Greiner et al.

(10) Patent No.: US 10,823,782 B2
(45) Date of Patent: *Nov. 3, 2020

(54) ENSURING COMPLETENESS OF INTERFACE SIGNAL CHECKING IN FUNCTIONAL VERIFICATION

(71) Applicant: International Business Machines Corporation, Armonk, NY (US)

(72) Inventors: Carsten Greiner, Holzgerlingen (DE); Minh Cuong Tran, Stuttgart (DE); Gerrit Koch, Ammerbuch (DE); Joerg Walter, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/806,922

(22) Filed: Nov. 8, 2017

(65) Prior Publication Data
US 2019/0094300 A1    Mar. 28, 2019

Related U.S. Application Data

(63) Continuation of application No. 15/714,071, filed on Sep. 25, 2017.

(51) Int. Cl.
*G01R 31/3183* (2006.01)
*G06F 30/33* (2020.01)
(Continued)

(52) U.S. Cl.
CPC ........... *G01R 31/318357* (2013.01); *G01R 31/318307* (2013.01); *G06F 30/33* (2020.01);
(Continued)

(58) Field of Classification Search
CPC ........ G06F 11/36–3696; G06F 17/5009–5081; G06F 2217/14; G06F 30/30–398; G01R 31/3181–318392
See application file for complete search history.

(56) References Cited

U.S. PATENT DOCUMENTS

| 6,029,002 A | * | 2/2000 | Afifi | G06F 8/433 |
| | | | | 714/E11.209 |
| 6,175,946 B1 | * | 1/2001 | Ly | G06F 17/5022 |
| | | | | 703/14 |

(Continued)

OTHER PUBLICATIONS

Moseley, Tipp, et al. "Shadow profiling: Hiding instrumentation costs with parallelism." International Symposium on Code Generation and Optimization (CGO'07). IEEE, 2007. (Year: 2007).*

(Continued)

*Primary Examiner* — Doon Y Chow
*Assistant Examiner* — Joanne G Macasiano
(74) *Attorney, Agent, or Firm* — Jared C. Chaney

(57) ABSTRACT

It is determined, if a simulated hardware signal of a design for an electronic circuit has an influence on a checker for simulation errors. To achieve this, a checker control flow database is generated for a static code description containing checkers and concerned simulated signals. Further, a database based on the output of instrumented verification code is generated, thus gaining dynamic information about the verification code. Herein, the hardware signal values will be associated with colored values or, alternatively, attributed values. For the checkers in the checker control flow database, a list of attributes is generated and stored. Based on the above operations, a hardware signal database is generated, wherein hardware signals are mapped to a list of checkers, based on determining, for each checker in the checker database, the associated hardware signals from its list of attributed values.

19 Claims, 20 Drawing Sheets

(51) Int. Cl.
   *G06F 30/3323*  (2020.01)
   *G06F 30/30*    (2020.01)
   *G06F 30/333*   (2020.01)
   *G06F 30/398*   (2020.01)

(52) U.S. Cl.
   CPC .......... *G06F 30/3323* (2020.01); *G06F 30/30* (2020.01); *G06F 30/333* (2020.01); *G06F 30/398* (2020.01)

(56) References Cited

U.S. PATENT DOCUMENTS

| | | | |
|---|---|---|---|
| 6,430,741 B1* | 8/2002 | Mattson, Jr. | G06F 11/3676 714/E11.209 |
| 6,484,134 B1* | 11/2002 | Hoskote | G01R 31/31835 703/14 |
| 7,478,028 B2 | 1/2009 | Ho et al. | |
| 8,024,691 B2 | 9/2011 | Zilic et al. | |
| 8,214,774 B2* | 7/2012 | Nardone | G06F 17/5068 326/101 |
| 8,381,192 B1* | 2/2013 | Drewry | G06F 11/3624 712/233 |
| 9,057,764 B2 | 6/2015 | Mostow | |
| 9,286,426 B2* | 3/2016 | Bobok | G06F 17/5045 |
| 9,436,449 B1 | 9/2016 | Chandnani et al. | |
| 2003/0069724 A1* | 4/2003 | Schubert | G01R 31/318357 703/16 |
| 2007/0074137 A1* | 3/2007 | Nishida | G06F 17/5022 716/103 |
| 2007/0168730 A1 | 7/2007 | Memmi | |
| 2010/0201400 A1* | 8/2010 | Nardone | G06F 17/5068 326/101 |
| 2011/0107297 A1* | 5/2011 | Chandra | G06F 8/433 717/110 |
| 2013/0110487 A1* | 5/2013 | Mostow | G01R 31/318357 703/14 |
| 2014/0095934 A1* | 4/2014 | Dancy | G06F 11/3684 714/32 |
| 2014/0100841 A1 | 4/2014 | Bures et al. | |
| 2015/0074651 A1* | 3/2015 | Chockler | G06F 11/3616 717/126 |
| 2015/0310154 A1* | 10/2015 | Bobok | G06F 17/5045 716/106 |
| 2016/0328505 A1* | 11/2016 | James | G06F 17/5036 |

OTHER PUBLICATIONS

Ke, Yi-Ju, Yi-Chieh Ghen, and Jng-Jer Huang. "An integrated design environment of fault tolerant processors with flexible HW/SW solutions for versatile performance/cost/coverage tradeoffs." 2017 International Test Conference in Asia (ITC—Asia). IEEE, Sep. 15 2017. (Year: 2017).*

Pinilla, Jose P., and Steven JE Wilton. "Enhanced source-level instrumentation for FPGA in-system debug of High-Level Synthesis designs." 2016 International Conference on Field-Programmable Technology (FPT). IEEE, 2016. (Year: 2016).*

Rezaeian, "Simulation and Verification Methodology of Mixed Signal Automotive ICs," Lund University, Department of Electrical and Information Technology, Nov. 22, 2012, 58 pages.

Greiner et al., "Ensuring Completeness of Interface Signal Checking in Functional Verification," U.S. Appl. No. 15/714,071, filed Sep. 25, 2017.

List of IBM Patents or Patent Applications Treated as Related, Dated Nov. 6, 2017, 2 pages.

* cited by examiner

ENSURING COMPLETENESS OF INTERFACE SIGNAL CHECKING IN FUNCTIONAL VERIFICATION

BACKGROUND

The present invention relates to the field of verification, and more particularly relates to a method of ensuring completeness of interface checking in functional verification of a circuit design.

In hardware development, the functionality of the simulated hardware is ensured by writing verification software or verification IP, that checks the simulated hardware and reports errors on unexpected behavior. These checks are based on values retrieved from the simulated hardware and comparing those to expected values.

In a legacy verification software or towards the end of a hardware development project it is important to understand which checks are contained in the verification software. Current methods are concentrated on manual review of the verification code and compare the verification code with manually created lists of checks.

Other solutions try to establish a connection between the signals from the design under test's (DUT) and the verification software by ensuring that the design under test's (DUT's) signal are monitored by the verification software.

SUMMARY

Various embodiments provide for a computer implemented method to ensure completeness of interface signal checking in a functional verification of a chip design, a computer program product and further computer implemented method as described in the independent claims. Embodiments of the present invention can be freely combined with each other if they are not mutually exclusive.

In one aspect, the invention relates to a computer implemented method to ensure completeness of interface signal checking in a functional verification of a chip design, including: performing, by a computer system, a static source code analysis of a verification software source code, resulting in a list of interface signals to be verified in a checker control flow database, instrumenting the verification software source code by adding an attribute value and code to a variable representing an interface signal variable, running, based on an executable the instrumenting the verification software, a verification against chip design, resulting in an instrumentation database, determining, from the instrumentation database, all occurrences of accesses to the interface signal variable, matching all of the occurrences with the checker control flow database, thus obtaining a list of interface signal variables that have not been checked in running the verification.

In a further aspect, the invention relates to a computer program product including a non-transitory computer readable storage medium having program instructions embodied therewith, the program instructions executable by a processor to cause the processor to perform a method including: performing, a static source code analysis of a verification software source code, resulting in a list of interface signals to be verified in a checker control flow database, instrumenting the verification software source code by adding an attribute value and code to a variable representing an interface signal variable, running, based on an executable of the instrumented verification software, a verification against chip design, thus obtaining a trace file, determining, from the trace file, all occurrences of accesses to the interface signal variable, and matching all of the occurrences with the checker control flow database, thus obtaining a list of interface signal variables that have not been checked in running the verification.

In a further aspect, the invention relates to a computer implemented method to ensure completeness of interface signal checking in a functional verification of a chip design, including: performing, by a computer system, a static source code analysis of a verification software source code, resulting in a list of interface signals to be verified in a checker control flow database, instrumenting the verification software source code by adding a color and code to a variable representing an interface signal variable, running, based on an executable of the instrumented verification software, a verification against chip design, resulting in a trace file, determining, from the trace file, all occurrences of accesses to the interface signal variable, matching all of the occurrences with the checker control flow database, thus obtaining a list of interface signal variables that have not been checked in running the verification.

DETAILED DESCRIPTION

Figure 1:
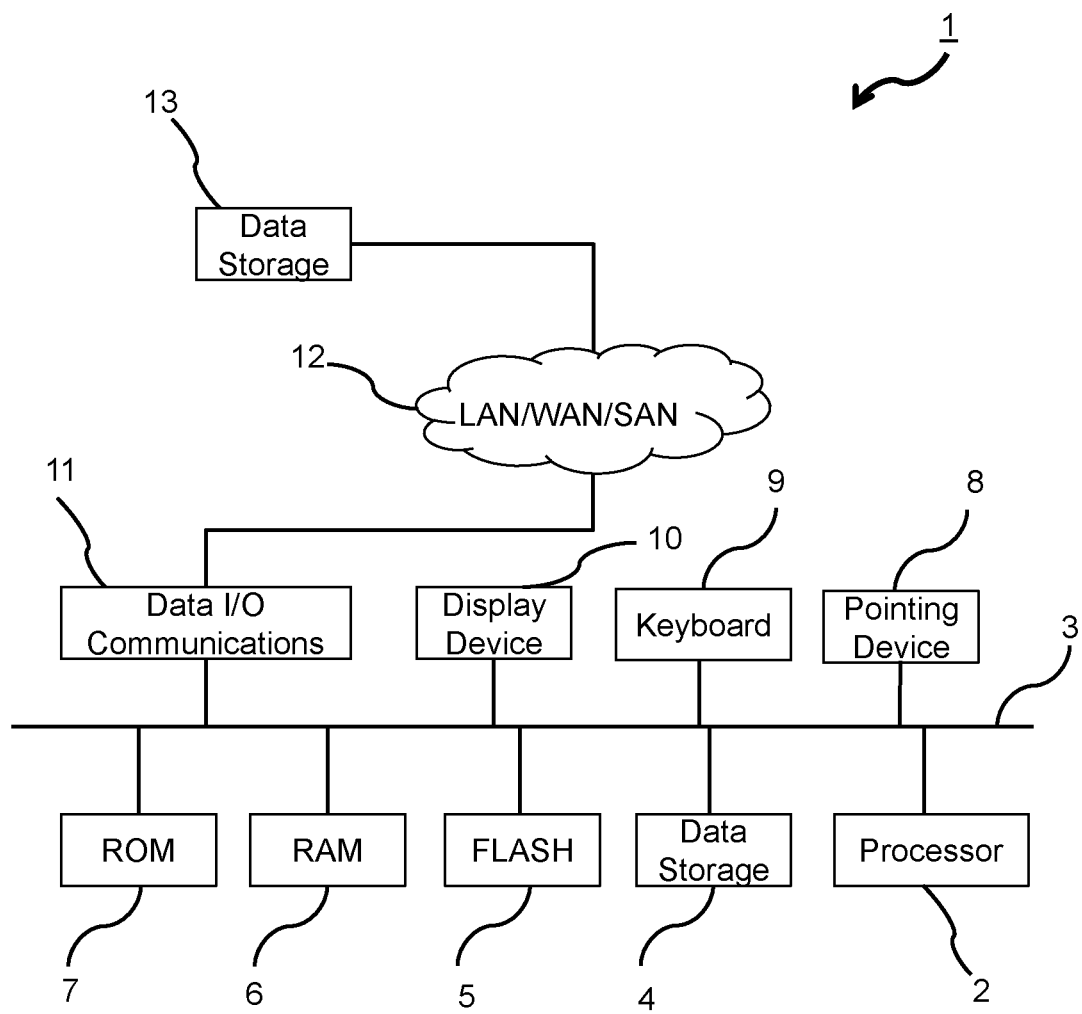
FIG. 1 shows a block diagram of a computer processing system in accordance with an exemplary embodiment of the present invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In an embodiment, the present method, as described below, may provide a tool to ensure completeness of interface signal checking in a functional verification of a chip design. In an embodiment, all interface signals that may be expected to be issued by a chip, are issued at least once, so that a complete testing coverage of a behavior of the chip may be verified.

In an embodiment, the method may further comprise performing, for building a checker control flow database, a static source code analysis in a verification software source code, thus obtaining a list of interface signals to be verified. This may provide information about all tested interface signals.

In an embodiment, the method may further comprise instrumenting the verification software source code by adding an attribute value and a code to a variable representing an interface signal variable. For example, the instrumenting may be achieved by putting the signal variable into a wrapper class and adding a new member variable "attribute" beneath the original signal variable. For example, the instrumenting may additionally be achieved by adding a member method, via writing at least one of the signal variable name (e.g., the attribute value), when making a comparison of the signal variable with some constant value. In an embodiment, writing the signal variable name will trace the access to the signal variable. In an embodiment, the attribute value is written into the trace file to catalog occurrences of an access to the signal variable. In an embodiment, the attribute is a color or an abbreviation of the otherwise lengthy name of the signal variable.

In an embodiment, the method may further comprise building an instrumentation database based on the instrumented verification software source code. This may provide an exhaustively complete list of all signal variables involved in the verification software, that may be used in later operations.

In an embodiment, the method may further comprise running, based on the executable of the instrumented verification software, a verification against a chip design, thus obtaining a trace file. The executable of the instrumented verification software may be built by the processes of compiling and linking, as is known in the art. The chip design might be implemented in a hardware description language simulating the electrical behavior of the chip or design under test.

The method may further comprise determining, from the trace file, all occurrences of accesses to the interface signal variable. This may provide information about whether a specific interface variable has been checked or not.

The method may further comprise matching all said occurrences with the checker control flow database, thus obtaining a list of interface signal variables that have not been checked in running the verification. This may return which interface variable has not been tested, so that it is possible for a testing engineer or a verification engineer to make corrections to the verification software or, to inform a design engineer about this situation to take appropriate measures.

An "interface signal," as used herein, refers to a signal at a pin or a group of pin hat the chip under test. In particular, "interface signal" may mean an output signal issued by the chip.

A "static source code analysis," as used herein, refers to a process of parsing through source code with regard of finding, in particular, the signal variables.

A "checker control flow database," as used herein, refers to a database containing the parts of software checking a specific signal and the name of the corresponding signal variable.

In particular, a "checker" may mean a part of code that checks, whether a value of a signal issued by the chip design is identical to an expected value. Such checker may also be denoted as "simchecker".

A "verification end node," as used herein, may mean a statement of returning, from a testing part of the verification software, with a specific error message. A verification end node may also be denoted as "simerror".

A "verification software," as used herein, refers to a software, that sends out stimuli towards a chip design under test and compares the response interface signals from the chip to expected values.

"Instrumenting," as used herein, refers to enriching a software by further variables and trace statements as is known in the art.

An "instrumentation database," as used herein, refers to a database reflecting all occurrences of instrumented variables in the static code.

In an embodiment, "running," as used herein, refers to letting the executable of the verification software execute, and, at the same time, letting the chip design run, wait for stimuli from the verification software, and respond to the stimuli of the verification software by issuing signals.

According to one embodiment, the attribute may be at least one of a color, a pictogram, a pattern, an abbreviation of a variable or signal name, or a binary hash value of a variable or signal name. In an embodiment, this is used to display an area filled with a specific color or symbol, instead of a lengthy name of a signal variable, thus offering better readability for a human. Further, the attribute may be represented by a binary hash value, so that, instead of having to transport, in the trace file, the lengthy signal variable names, only the relatively short binary hashes, so that an amount of data to be transported, and thus time, may be reduced.

According to one embodiment, the verification software is written in a high level programming language. This may be used to configuring a parser for working on the source code.

According to one embodiment, performing the static source code analysis comprises creating a control flow graph of the verification software. A "control flow graph" as used herein, may be a visual or condensed presentation of the otherwise complex source code.

According to one embodiment, performing the static source code analysis comprises finding all verification end nodes in the verification software. In an embodiment, each signal variable checked may be associated with a point, in the source code, of returning or, giving the control back to the calling routine.

According to one embodiment, performing the static source code analysis comprises performing a backward analysis in order to find, for each verification end node, all signal variables that are checked before the control flow reaches the verification end node.

According to one embodiment, performing the static source code analysis comprises determining all interface signal variables from which a verification end node depends.

According to one embodiment, the instrumenting the verification source code comprises selecting the attribute to be able to unambiguously represent the interface signal variable by the selected attribute. For example, when there might be 10 interface variables under observation, 10 different colors might be attributed to them in code instrumentation, so that, on a display or a printout, showing occurrences of signals or occurrences of missing signals. In an alternative embodiment, instead of color, e.g., a number of symbols might be selected to represent the respective signals.

According to one embodiment, the instrumenting the verification source code may comprise inserting a write statement associated with the interface signal variable, the write statement being configured to write the value of the attribute into a trace file when the interface signal variable is referenced. As used herein, "referenced" in particular may have the meaning of obtaining a value assigned or being used with a mathematical, logical or binary operation. Thus, in a trace file, e.g., an access to the respective signal variable might be traced. In particular, there might be traced the call of a comparison method, the instrumented comparison method overwriting the original comparison method and having added a write statement for trace output. Further, the attribute may be added to an attribute list of the assigned attributed variable. Additionally, instrumenting the verification source may comprise inserting one or more logical operations between attributed variables.

According to one embodiment, the building of the instrumentation database from the instrumented verification software source code comprises collecting all interface variables and attributes representing the respective interface signal variable. Alternatively or additionally, instrumentation may be performed by collecting the attributes and storing the attributed variables in a separate file. Which separate file may then form one example of the instrumentation data base.

According to one embodiment, matching the occurrences comprises matching all attribute values representing the respective interface signals from the instrumentation database with the entries of the checker control flow database.

According to one embodiment, matching the occurrences comprises obtaining a list of verification end nodes with respective attribute values representing the respective interface signals, that are to be found in the trace file and, based on the result, building a checker database.

According to one embodiment, matching the occurrences comprises, for each interface signal variable from the checker control flow database, along with its representing attribute value: retrieving the identical attribute values from a checker database; relating a respective verification end node associated to each respective attribute value to each interface signal; determining of interface signals that have no verification end node associated.

In an embodiment, matching occurrences may compare what, according the verification code, is expected to be tested with what is really tested in the test run.

According to one embodiment, the method comprises establishing a coverage hole report. Thus, a report may be generated, after completely testing the chip design, or providing a test, relating an amendment of the verification software or the chip design might be rendered necessary.

A "coverage hole report" as used herein may mean a report indicating which signal variables have not been issued by the chip design under test, although, according the verification code, the testing of the signal variable was expected.

According to one embodiment, the method comprises establishing a signal and checker coverage report. In an embodiment, a user may obtain a digest about all signals checked during test run.

According to one embodiment, the method comprises creating a checker dependency network by: extracting names of verification end nodes from a checker database; connecting the verification end nodes; collecting weight attributes; associating weights to the connections; visual reporting of grouping checkers based on weights. In an embodiment, the method thus provides information about signal variables that are logically connected to each other.

The aforementioned method may further comprise displaying, based on the matching, all occurrences of colors from the instrumented verification code, along with the signal variable name each color respectively represents, and a verification end node name depending on whether it was run through in the running or not, thus providing an easy to read digest concerning the test coverage.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

In an embodiment, computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A block diagram illustrating an example computer processing system adapted to implement the methods of the present invention is shown in FIG. 1. The computer system 1, generally referenced, comprises a processor 2 which may comprise a digital signal processor (DSP), central processing unit (CPU), microcontroller, microprocessor, microcomputer, ASIC or FPGA core. The system also comprises static read only memory 7 and dynamic main memory 6 and may also comprise a FLASH memory 5. The processor 2 3 is in communication with any of said memory devices as well as with peripheral devices such as a display device 10, a keyboard 9, a pointing device 8, such as, e.g., a mouse or a tablet via a bus.

The computer system is connected to one or more external networks such as a LAN or WAN or SAN 12 via communications lines connected to the system via one or more data I/O communication interfaces 11, e.g. a network interface. The one or more data I/O communication interfaces 11 coupled to the system enable the data processing system to become coupled to other data processing systems or remote printers or storage devices through intervening public or private networks. Modem, cable modem and Ethernet cards are just a few of the currently available types of network adapters. The system comprises also a magnetic or semiconductor based data storage or storage device 4 and/or 13 for storing application programs and data. The system comprises computer readable storage medium that may include any suitable memory means, including but not limited to, magnetic storage, optical storage, semiconductor volatile or non-volatile memory or any other memory storage device.

Verification of a Hardware Design

Verifying that a hardware design of a semiconductor chip functions properly is of utmost importance, because, if an error in design is not found before producing the hardware, high costs may arise to the manufacturer. To achieve this, a conventional verification environment for testing the correctness of a circuit design by simulation typically includes, among other verification components, checker to verify that signals of the design behave as expected, relative to themselves and relative to other signals. These checkers report an error each time they detect that an output signal outputted by the simulator of the design under test (DUT) is not identical to the expected output signal that is implemented in the verification software.

Figure 2:
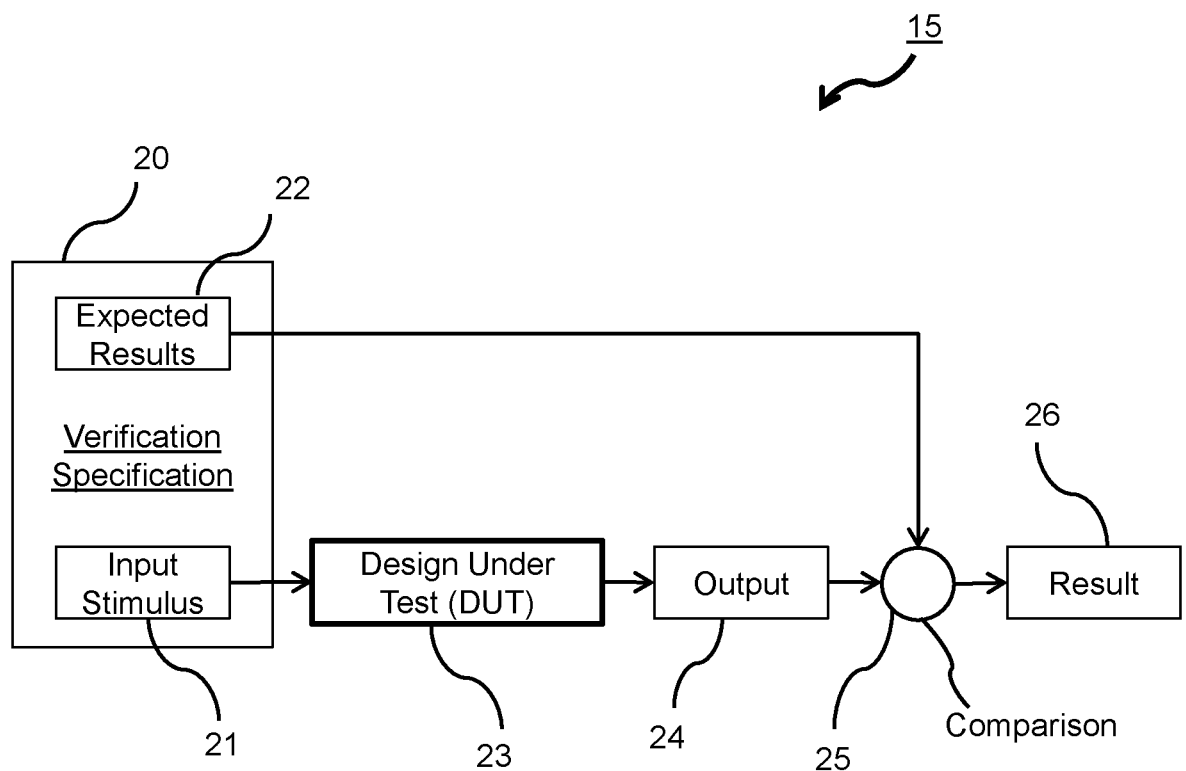
FIG. 2 shows a verification environment in accordance with an exemplary embodiment of the present invention.

In FIG. 2, an exemplary verification environment 15 is depicted: A verification specification 20, that might be written in a high level programming language such as C++ or Verilog that is specific for verifying a DUT 23, comprises software parts 21 issuing input stimuli, i.e. predefined signals, towards the DUT 23, that might be a simulator of the hardware design. The DUT 23, based on the input signals or input stimulus (issued by software parts 21), calculates an output 24 that is forwarded to a comparison component 25. The comparison component 25 compares the output 24 from the DUT 23 to one or more expected result(s) 22 that are also specified in the verification specification 20. In computer language, this apparent complicate process might mainly be implemented, e.g., by a simple assert-statement. A result 26 of the verification gives an information as to whether or not the DUT 23 exhibited the expected behavior.

As verification components are usually written in a high level language like C++ or Verilog, the retrieving of values from the simulated hardware can therefore usually be tracked down to a small number function calls (like getValue( )) that interact directly between the verification code and the hardware simulator. The checks itself are then based on a number of calculations and endup in a boolean expression that is followed by code reporting an unexpected behavior, i.e. an error.

A computer-implemented method of determining if a simulated hardware signal of a design for an electronic circuit has an influence on a checker for simulation errors written in a high-level programming language might comprise one or more of the following: generating a checker control flow database containing each checker along with influencing control variables by performing static code analysis on verification code for logic simulations of said design; generating an instrumentation database containing attributed values for hardware signal values by performing a data flow analysis on verification code using code instrumentation; for each checker in the checker control flow database generating a list of attributes by determining the colors of its control variables stored in the instrumentation database and storing the list in the checker database; generating a hardware signal database wherein hardware signals from said design are mapped to a list of checkers by determining for each checker in the checker database the associated hardware signals from its list of attributes, as described below. An effect of above method is that information may be gained about whether the signals are actually used and checked functionally.

For example, it may be determined, if a simulated hardware signal of a design for an electronic circuit has an influence on a checker for simulation errors. To achieve this, a checker control flow database may be generated for a static code description containing checkers and concerned simulated signals. Further, a database based on the output of instrumented verification code may be generated, thus gaining dynamic information about the verification code. Herein, the hardware signal values may be associated with colored values or, alternatively, attributed values. For the checkers in the checker control flow database, a list of attributes may be generated and stored. Based on the above operations, a hardware signal database may be generated, wherein hardware signals are mapped to a list of checkers, based on determining, for each checker in the checker database, the associated hardware signals from its list of attributes. Thus, a method is suggested, for ensuring completeness of interface signal checking in functional verification.

In other words, a method for ensuring completeness of interface signal checking in functional verification, the associated functional verification checker being written in a high-level programming language, might comprise one or more of the following: generating a checker control flow database containing each checker along with influencing control variables by performing static code analysis on verification code for logic simulations of said design; generating an instrumentation database containing attributed values (the values being attributed by appropriate attributes, as for, e.g., a color, a symbol, an abbreviated name of a hardware signal) for hardware signal values by performing a data flow analysis on verification code using code instrumentation, thus gaining information about the dynamic behavior of the verification code; for each checker in the checker control flow database generating a list of attributes by determining the attributes, e.g. colors, of its control variables stored in the instrumentation database and storing the list in the checker database; generating a hardware signal database wherein hardware signals from said design are mapped to a list of checkers by determining for each checker in the checker database the associated hardware signals from its list of attributes. Based on this method, signals that are not checked in the verification code, may be easily identified, thus having a means for ensuring completeness of interface signal checking in functional verification. The method is described below in further detail:

Operation 1: In an embodiment, the method may automatically analyze the verification code for structures that indicate reporting of an error. The preceding code will then be structured to determine variables and function calls influencing the check required to fail for an error.

Operation 2: This checker control flow tree may then be used to produce a database listing each checker along with influencing control variables.

Operation 3: In a second operation code instrumentation may be applied to the verification software in order to perform an extended, dynamic Data Flow analysis of hardware signal values within the verification code. The method might use a reduced set of components of Data Flow Analysis like Refer and Assign. As Data Flow Analysis usually intends to find flaws in software, there may be a need to extend this method by tracking the flow of the hardware signal value throughout the program.

Operation 4: A result of this method may then be a database with entries for every Attributed or Colored Value, each of them identified by its scope, variable name and its assigned attributes or colors.

Operation 5: In a third operation, the result of the operation 2—the checker control database—may then be used to associate each checker with attributes or colors and as such with actual hardware signals.

Operation 6: With this result, the method might then outline each signal and associated checker, as well as checkers that have no checking code associated, indicating obvious checker holes.

Operation 7: In a further operation, the method might analyze the checkers and create logical connections to other checkers, that are based on previously calculated attributes, to enable a structured approach for further coverage and checker review.

It is to be understood, that, in embodiments, an attribute might be a color. Alternatively or supplementary, the attribute might be a pictogram. Further alternatively or supplementary, the attribute might be an abbreviated name of a signal or binary hash value of the name of the signal, that is usually made up by a long string of characters.

The skilled person understands that such attribute is a physically measurable entity that easily may become tangible when printed.

Figure 3:
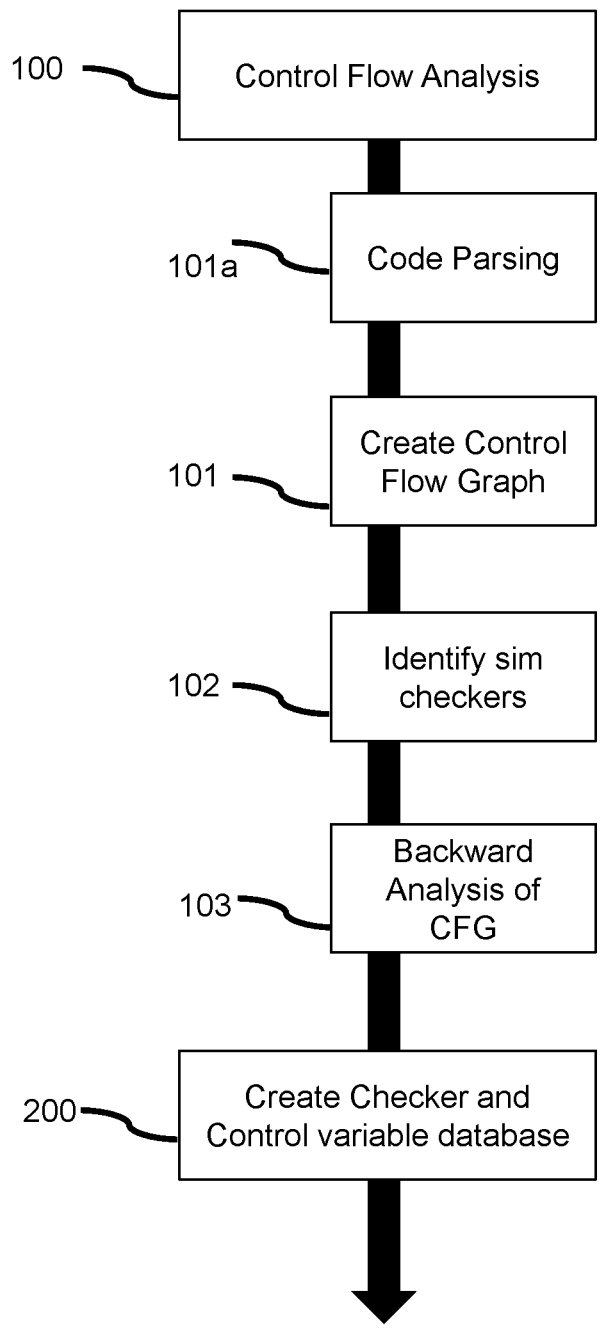
FIG. 3 shows a flowchart of creating a checker and a control variable database in a determination method in accordance with an exemplary embodiment of the present invention.

FIG. 3 is an illustration of a flowchart of an embodiment of above method. Beginning with a control flow analysis operation 100, the verification code may be automatically analyzed for structures that indicate reporting of an error. A preceding code may then be structured to determine variables and function calls influencing the check required to fail for an error. In a very simple example, this might be performed by a "grep" (as a skilled person in the art of shell scripting on UNIXoid computer operating systems is well aware of) that is configured to find an assert-statement, e.g., assert (PIN_01=0)—then the method might walk up the code to find any statements influencing the variable PIN_01. This is supported by an operation of code parsing 101a.

Subsequently, the method may create 101 a control flow graph. This graph may be reduced to contain only decision nodes leading to checker, i.e. simerrors or simulation errors. In this regard, a simulation is an event that occurs when an error situation is detected, i.e., when the simulated DUT behaves different than is specified in the verification specification. The control flow graph will start operation 102 then at a simerror to analyze the decision nodes and each involved variable, in other words, the method identifies operation 102 relating to sim checkers. In a backward analysis of CFG 103, the variables and functions impacting the simerror may be retrieved and collected. In operation 200, based on the findings outlined above, a checker and control variable database may be created, i.e., the checker control flow tree may then be used to produce a database listing each checker along with influencing control variables.

Figure 4:
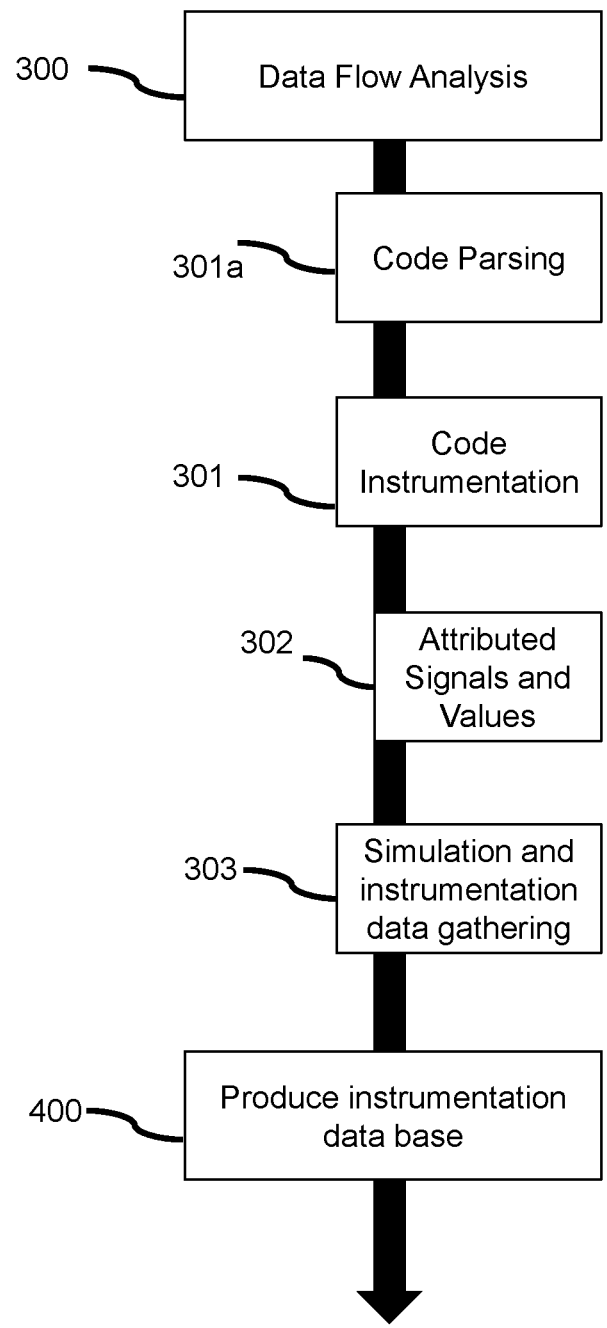
FIG. 4 shows a flowchart of producing an instrumentation database in a determination method in accordance with an exemplary embodiment of the present invention.

Referring to FIG. 4, in an embodiment, an instrumentation of the verification code is depicted. The skilled person is generally aware of the tool of code instrumentation. Code instrumentation is a means for gaining additional information about the code at the point of time when being executed, that is at runtime, so that a dynamic analysis of the executed code about this very executed code may be gained during execution. A very simple example of a code instrumentation might be manually adding trace-statements reciting the local function name and value of some variable in a print-statement.

Herein, in the second operation of above method, code instrumentation may be employed to perform 300 an extended, dynamic data flow analysis of hardware signal values within the verification code. The method might use a reduced set of components of data flow analysis like refer and assign. As a data flow analysis usually intends to find flaws in software, it is necessary to extend the data flow analysis by tracking the flow of the hardware signal value throughout the program.

The data flow analysis may begin with an operation of code parsing 301a for retrieving code parts, i.e. functions, variables, statements, that are to be instrumented.

In operation 301, code instrumentation, the instrumentation may be done by extending the representation of the hardware signal value with an attribute, as for, e.g., color, or a pictogram or a short abbreviated name of the hardware signal to be represented. A reference of signals then may lead to transfer of the attribute, e.g. color, to the assigned variable (value)—for this, an instrumentation may be performed for values by introducing "colored value" or "attributed value".

In operation 302, attributed signals and values, each further reference of cited colored value or attributed value might then cause further transfer of the color or attribute and an accumulation of colors or attributes wherever references of signals or colored values or attributed values occur.

In operation 303, simulation and instrumentation data gathering, data flow data may then be gathered by running simulation with the instrumented code.

In operation 400, produce instrumentation data base, a result of the above method operations may then be a database with entries for every colored value or attributed value, each of them identified by its scope, variable name and its assigned colors or attributes. Thus, a database of specific aspects of the dynamic behavior of the verification code may be established.

Figure 5:
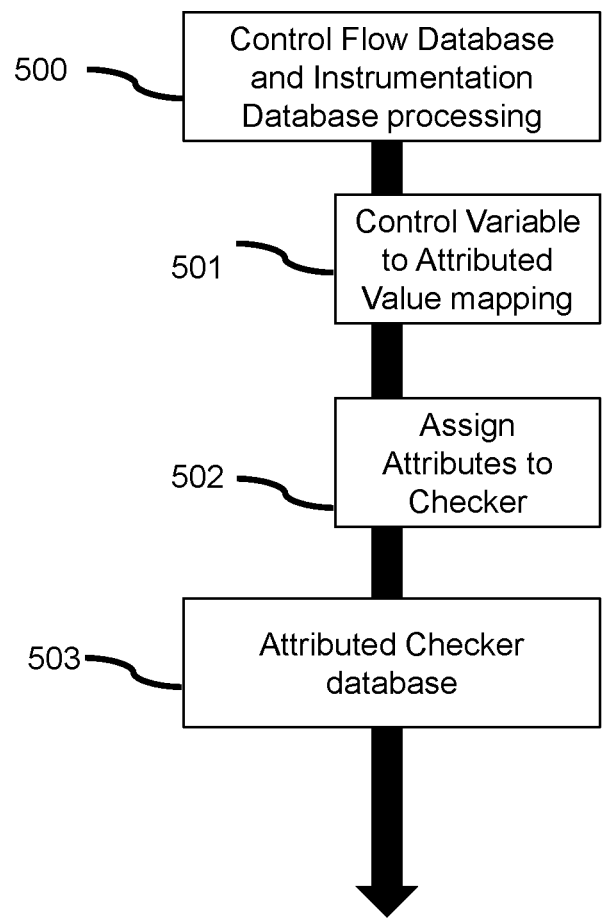
FIG. 5 shows establishing an attributed checker database in a determination method in accordance with an exemplary embodiment of the present invention.

Turning to FIG. 5, in the third operation of above method, the result of the second operation of above method, the checker control database, may then be used, beginning with an operation 500, control flow database and instrumentation database processing.

In operation 501, control variable to attributed value mapping, each checker entry might be processed. For each attached variable, a lookup in the colored values database or attributed values database may be done.

In operation 502, assign attributes to checker, every found colored value or attributed value may then be used to identify the assigned colors or attributes and the colors or attributes will then be attached to the checker. Thus, the control variable may be replaced with a list of colors or a list of attributes.

Concerning operation 503, attributed checker database, a result of a database with colored checkers or attributed checkers may be gained.

Figure 6:
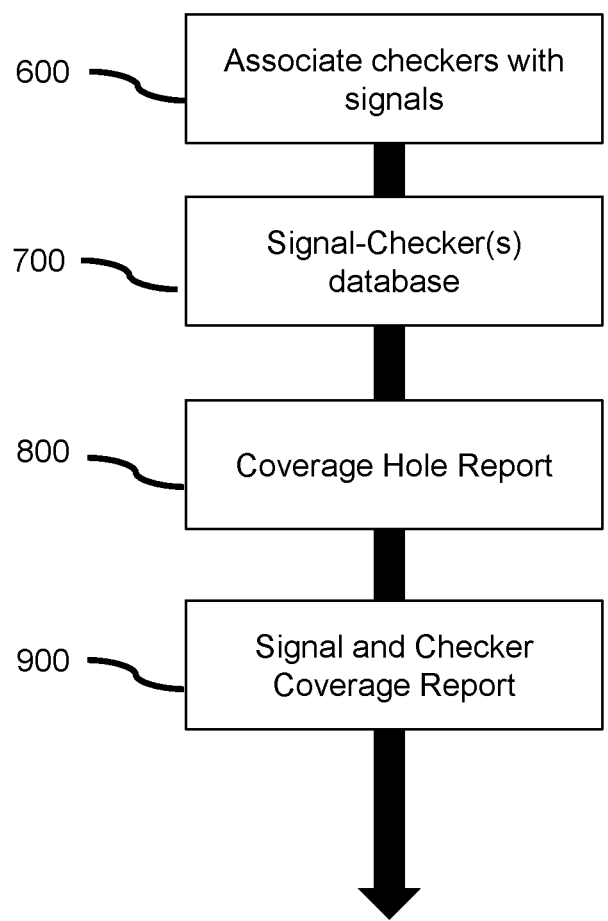
FIG. 6 shows producing a signal and checker coverage report in accordance with an exemplary embodiment of the present invention.

Turning to FIG. 6, in the next operation of above method, in operation 600, associate checkers with signals, the colors or attributes of the checkers may be traced back to the actual hardware signals. The respective checker might then be attached to this hardware signal.

In an operation 700, signal-checker(s) database, the gained result may be a database where each hardware signal may have a list if attached checkers—if an appropriate color or attribute was found.

In an operation 800, coverage hole report, a first report might then list the hardware signals that have no attached checkers. An empty list would then mean a full coverage of the DUT's interface signals.

In an operation 900, signal and checker coverage report, a second report might then list the hardware signal along with its checker and its attached control variables. Along with the checker's error message, this may then allow a structured human readable output that can subsequently be used for a checker coverage review.

Figure 7:
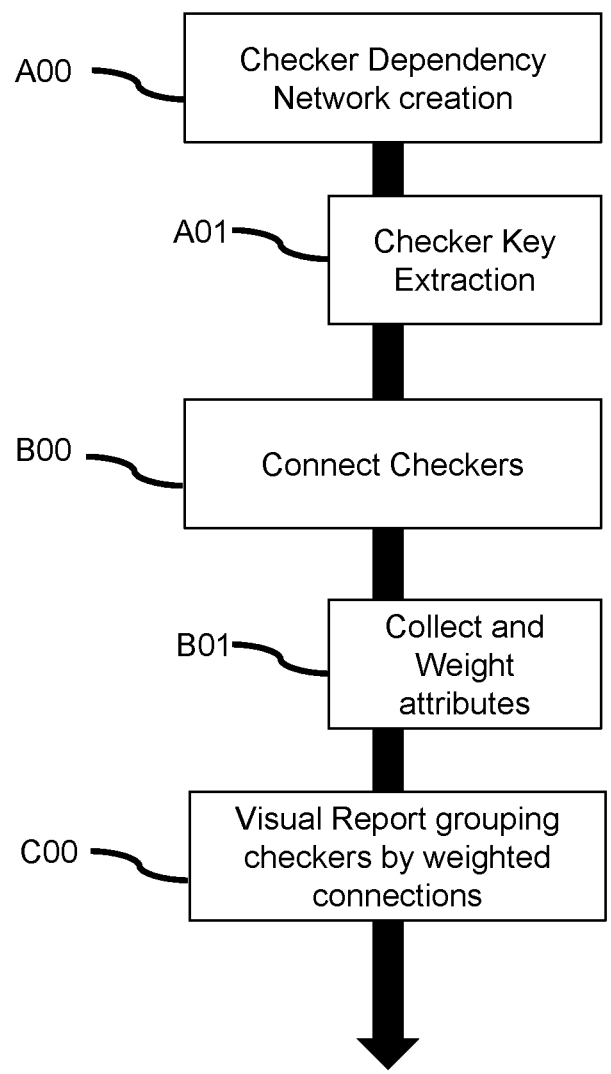
FIG. 7 shows building a visual report grouping checkers by weighted connections in accordance with an exemplary embodiment of the present invention.

Referring to FIG. 7, in an operation A00, checker dependency network creation, the above method might analyze the checkers and create logical connections to the other checkers.

In an operation A01, checker key extraction, the checkers error message may be structured by lexical analysis, i.e., the nouns will be extracted and used as "keys" for the further processing.

In an operation B00, connect checkers, logical connections between checkers are established by suboperations of operation B01, collect and weight attributes, according to the following criteria:

common control variables may add a weight to the connection common colors or common attributes may add a weight to the connection common key words of the checker message may add a weight to the connection the higher the weight, the stronger the connection.

In operation C00, visual report grouping checkers by weighted connections, the achieved result may then be a visual representation putting checkers with strong connections closer together. Thus, this result may be a further means for checker coverage review and may help to define a quality level of the verification code.

Figure 8:
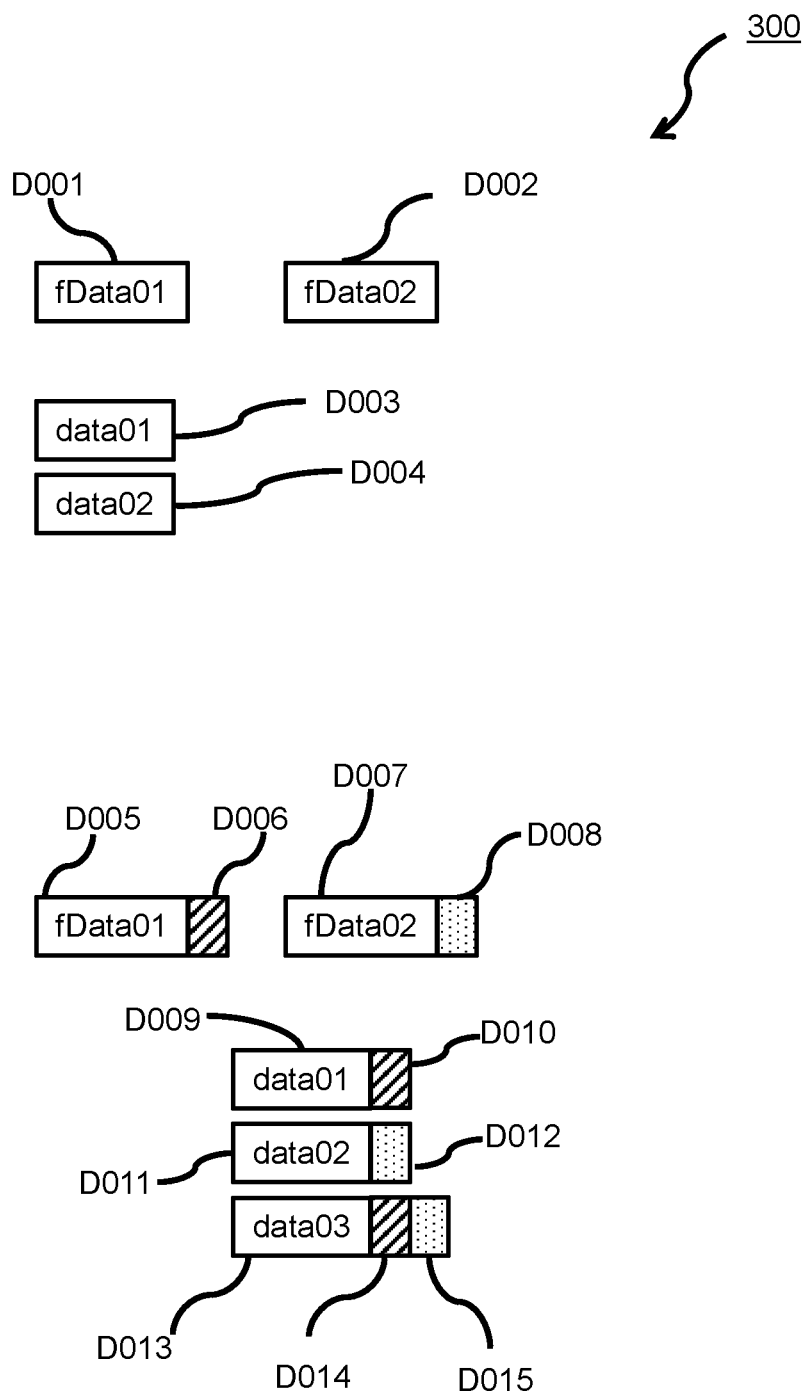
FIG. 8 shows an example of instrumenting a piece of example code in accordance with an exemplary embodiment of the present invention.

In an embodiment, FIG. 8 depicts an example of a code instrumentation in accordance with the above method. An existing code defining two instantiations fData01, D001, and fData02, D002, of a simulation class SimFacility, for example, SimFacility fData01, fData02, and two applications of the getter method .get64( ), for example unit 64 data01=fData01.get64( ) and unit64 data01=fData01.get64 ( ), for getting the values of the variables data01, D003, and data02 D004, may be instrumented.

The result of the instrumented code may be the facility class being replaced with an attributed version or colored version of it, wherein the value types are replaced by the attributed version or the colored version. Thus, there may be found an attributed class or a colored class AttributedSimFacility with a first instantiation fData01, D005, that may be attributed or colored, e.g., by a first attribute, D006, e.g., the color purple, or, a hatched pattern—as is shown in FIG. 8. A second instantiation fData02, D007, may be attributed or colored, e.g., by a second attribute, D008, e.g., the color blue, or, a dotted pattern—as is shown in FIG. 8. For example, in the instrumented code, facility is replaced with attributed version and value types are replaced with attributed version. For example, the code could be represented by:

```
AttributedSimFacility fData01,
fData02;
// instrumented types
Attributed<uint64> data01 = fData01.get64( );
Attributed<uint64> data02 = fData01.get64( );
// instrumented assignment:
Attributed<uint64> data03 = data01 + data02;.
```

Thus, a variable data01, D009, that may be got from instance fData01, may have the first attribute D010 identical to D006, e.g., the color purple or the hatched pattern. A variable data02, D011 that may be got from instance fData02, may have the second attribute D012 identical to D008, e.g., the color blue or the dotted pattern. An operation of an addition of the two variables may result in a third variable data03 D013 that may comprise, besides the payload value of the, e.g. arithmetically, added values of data01 and data02, a cumulated list D014, D015 of the attributes or colors or patterns D014 (being identical to D006) and D015 (being identical to D008). Thus, e.g., the origin of the data yielding to variable D013 may be easily seen. The skilled person is aware of means, as to achieve an instrumented assignment as is set forth above. E.g., the skilled person might add a dynamic list to the member variables of a class, the dynamic list being able to comprise all preceding data sources by storing the associated attributes, colors or patterns.

In other words, the above code instrumentation example shows details of operations of instrumentation data gathering as is already shown with regard to above operations 302 and 303 of FIG. 4. Instrumentation with distinct list of all gathered and influencing Colors may be required for an end to end processing from Facility (Signal) to SimError (Checker) which is an extension to classical Data Flow Analysis. Each Reference of a Signal requires the collection of the Color and transferring it to the assigned Value. Each Reference of a Value requires the collection of the contained Colors to the assigned Value.

Figure 9:
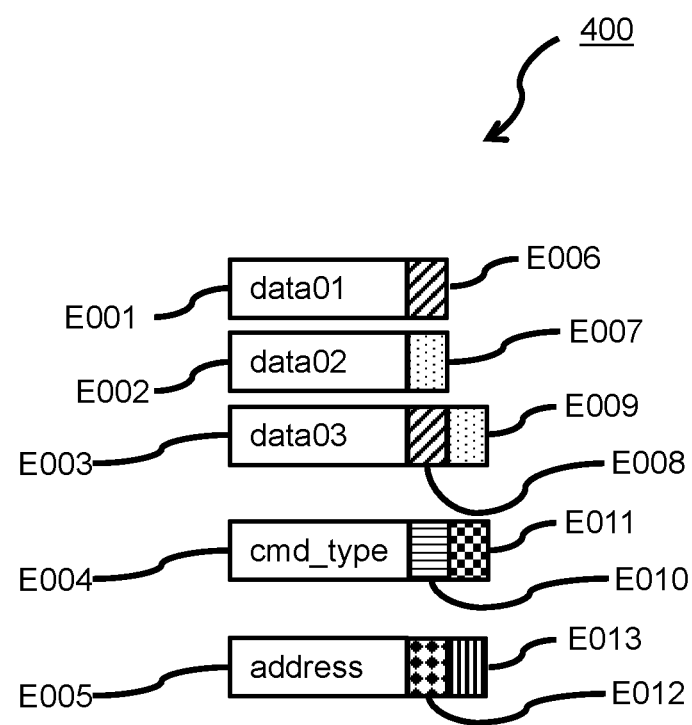
FIG. 9 shows variables associated with one or more attributes in accordance with an exemplary embodiment of the present invention.

FIG. 9 depicts an example of some entries of the code instrumentation database 400 as produced in operation 400 in FIG. 4: Subsequent to, e.g., the verification, code being instrumented, the dynamically, i.e. during runtime, collected instrumentation data may then written to the code instrumentation database.

In the following, for a better readability, it is preferably referred to attribute or attributed when it should be kept in mind, that an attribute, as used in the whole of the present description, can mean a color, a pattern, a pictogram, an abbreviated or binary hashed signal variable name.

For example, a variable data01, E001, might be associated with a first attribute E006, a variable datab 02, E002, might be associated with a second attribute, E007, a variable data03, E003, might be associated with two attributes, E008 and E009, a variable cmd_type E004 might be associated with two attributes, E010 and E011, and a variable address, E005, might be associated with two attributes E012 and E013. The skilled person will understand, that each variable might represent a signal.

Figure 10:
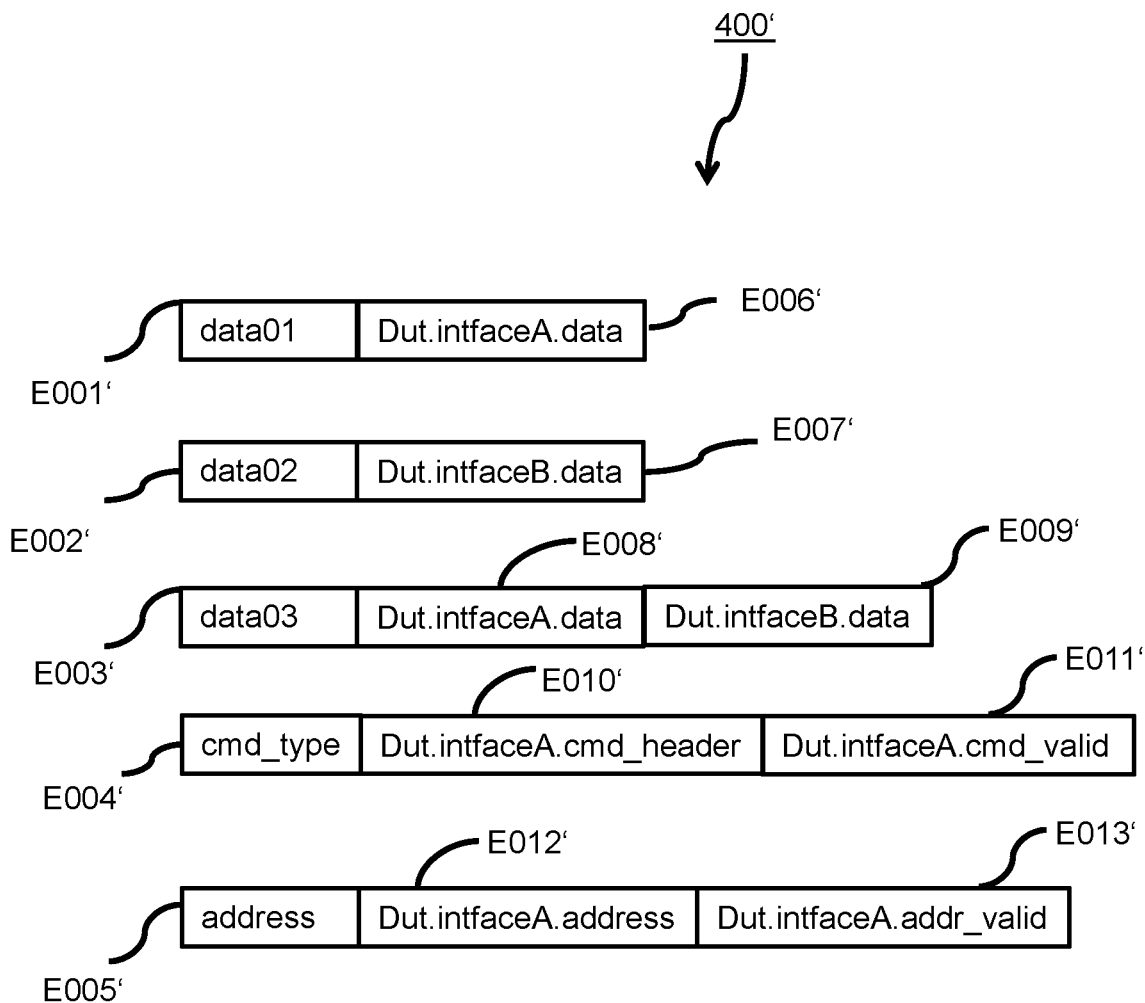
FIG. 10 shows another view of FIG. 9 in accordance with an exemplary embodiment of the present invention.

FIG. 10 is an alternative representation 400' of the code instrumentation database operation 400, similar reference signs referring to similar features. Herein, the attributes E006', E007', E008', E009', E010', E011', E012' and E013' are represented as abbreviated signal names, wherein Dut.intfaceA.data stands for "data signal of interface A of the design under test" and similar for the further attributes.

Figure 11:
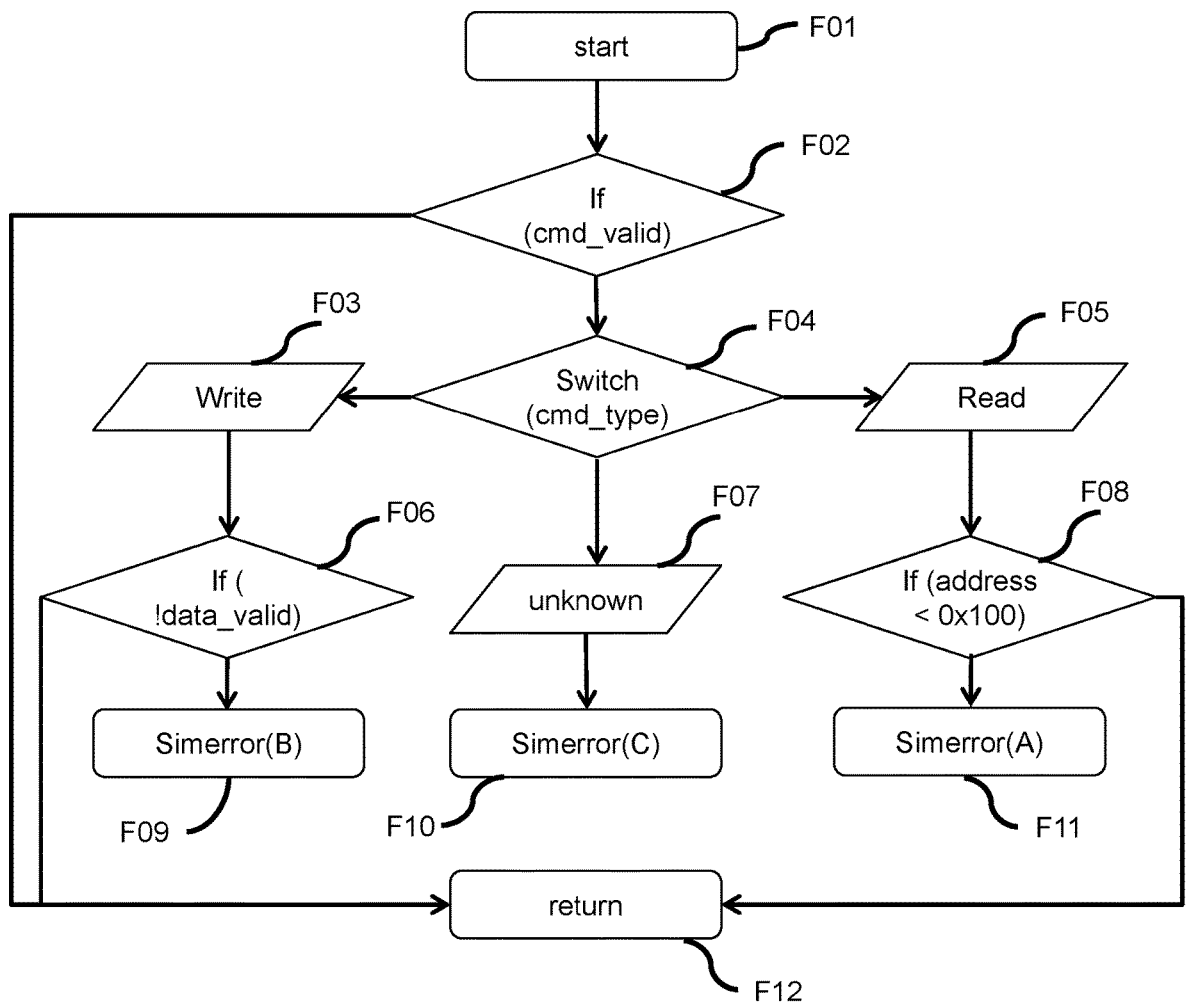
FIG. 11 shows an exemplary control flow graph in accordance with an exemplary embodiment of the present invention.

FIG. 11 exemplarily depicts a control flow graph based on forward analysis and simplified by ending analysis on the simerror "leafs", as an example of reference signs operation 100, 101 of FIG. 3.

In this exemplary and simplified code fragment flow chart executions start with start, F01. If, F02, the command is not valid, execution continues at the operation F12 of returning to the calling routine. If the command is valid and further verification is necessary, a switch statement F04 may be performed on the cmd_type.

If the cmd_type is "write", F03, execution may be continued with testing operation F06 as to whether the data is valid. If the data is valid, control is given back, F12, to the calling routine. If the data is not valid, i.e., !data_valid is true, a simerror(B), F09, may be recognized.

If the cmd_type is unknown, F07, a simerror(C), F10, may be recognized.

If the cmd_type is "read", F05, it is checked, F08, whether the address to be accessed is <0×100 (meaning an access to a memory cell with a number smaller than 256, that usually might represent a processor's stack). If it is not <0×100, execution control is given back to the calling routine. If it is <0×100, a simerror(A), F11, may be recognized.

Figure 12:
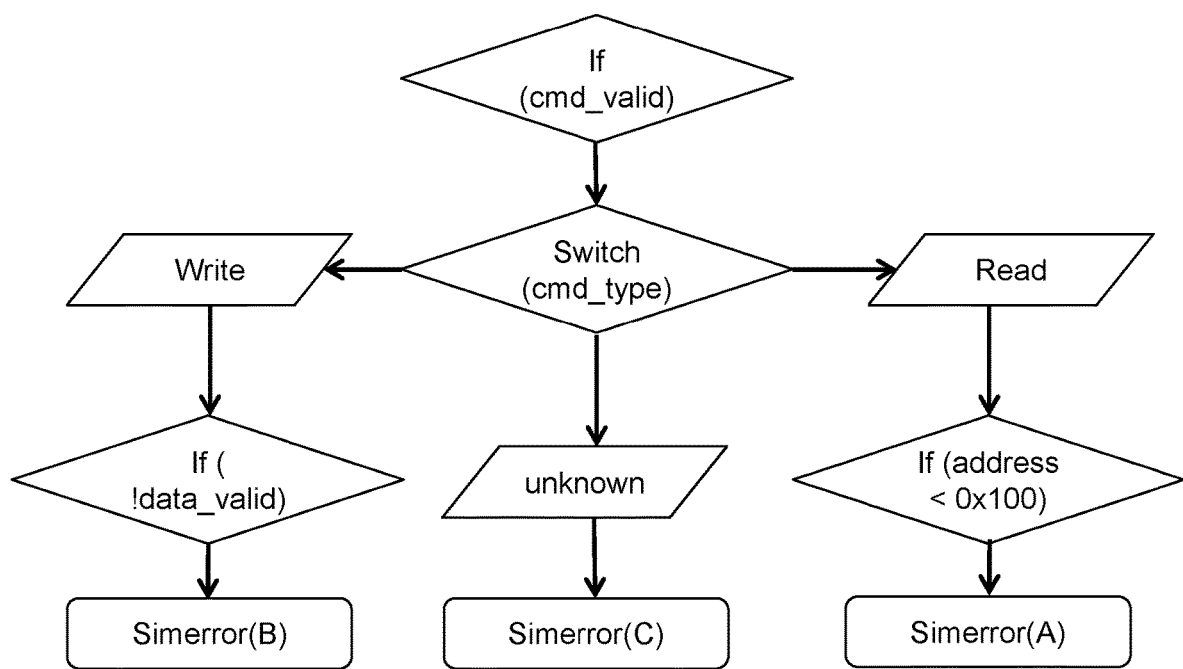
FIG. 12 shows a reduced control flow graph from FIG. 11 in accordance with an exemplary embodiment of the present invention.

FIG. 12 depicts a reduced control flow graph, in this case the reduced control flow graph of FIG. 11. Concerning reducing the control flow graph it is referred to reference sign 101 of FIG. 3. The reference signs in FIG. 12 correspond to the reference signs of FIG. 11 and refer to features corresponding to those of FIG. 11 so that a description may be omitted here.

Figure 13:
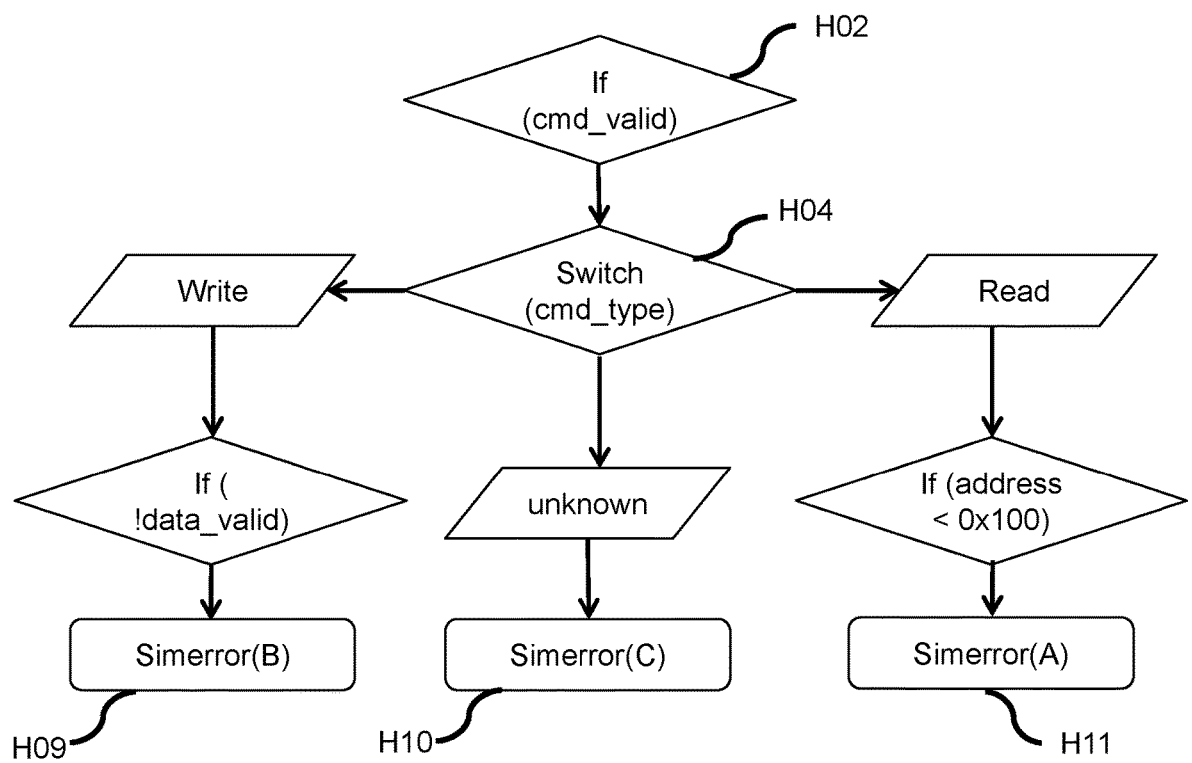
FIG. 13 shows a simerror control flow extraction in accordance with an exemplary embodiment of the present invention.

FIG. 13 exemplarily depicts the process of simerror control flow extraction as is already mentioned with respect to reference sign operation 102 in FIG. 3. The reference signs in FIG. 13 correspond to the reference signs of FIG. 11 and refer to features corresponding to those of FIG. 11 so that a description may be omitted here.

FIG. 13 illustrates the simerror control flow extraction in that, starting from the simerror, as for e.g., simerror(B), H09, simerror(C), H10, or simerror(A), H11, analysis goes upward in the code through the decision nodes H02 and H04 and attaches the variables at nodes H02 and H04 that are involved in the decision to the checker, compare operation 102 of FIG. 3. The variable from nodes H02 and H04 determine how the execution flows through the control flow.

Figure 14:
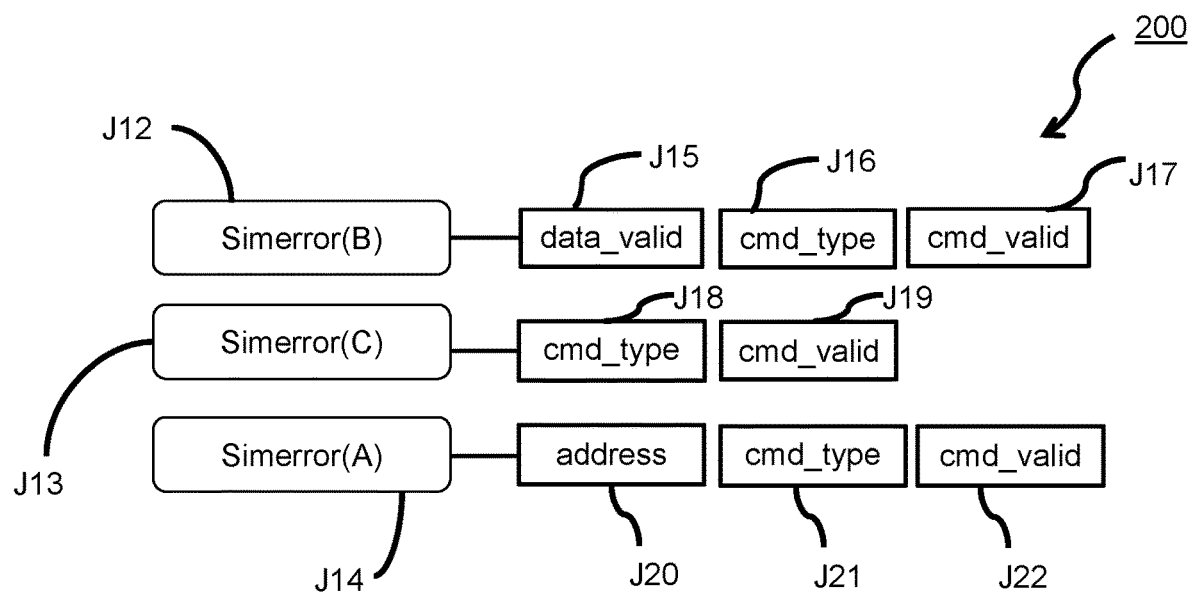
FIG. 14 shows the creation of the checker and control variable database in accordance with an exemplary embodiment of the present invention.

In an embodiment, FIG. 14 shows and example of the result of operations 102 and 200 of FIG. 3, symbolizing the creation of the checker and control variable database:

The checker and control variable database may be built on analyzing the control flows resulting into relationships like: Simerror(B), J12, is associated with checking variable data_valid, J15, variable cmd_type, J16, and variable cmd_valid, J17. In other words, when simerror(B) occurs, the checks on the signals cmd_valid, J17, cmd_type, J16, and data_valid, J15, are performed.

Similarly, simerror(C), J13, may be associated with checks on the variables cmd_type, J18, and cmd_valid, J19. Finally, simerror(A), J14, is associated with checks on address, J20, cmd_type, J21, and cmd_valid, J22.

Figure 15:
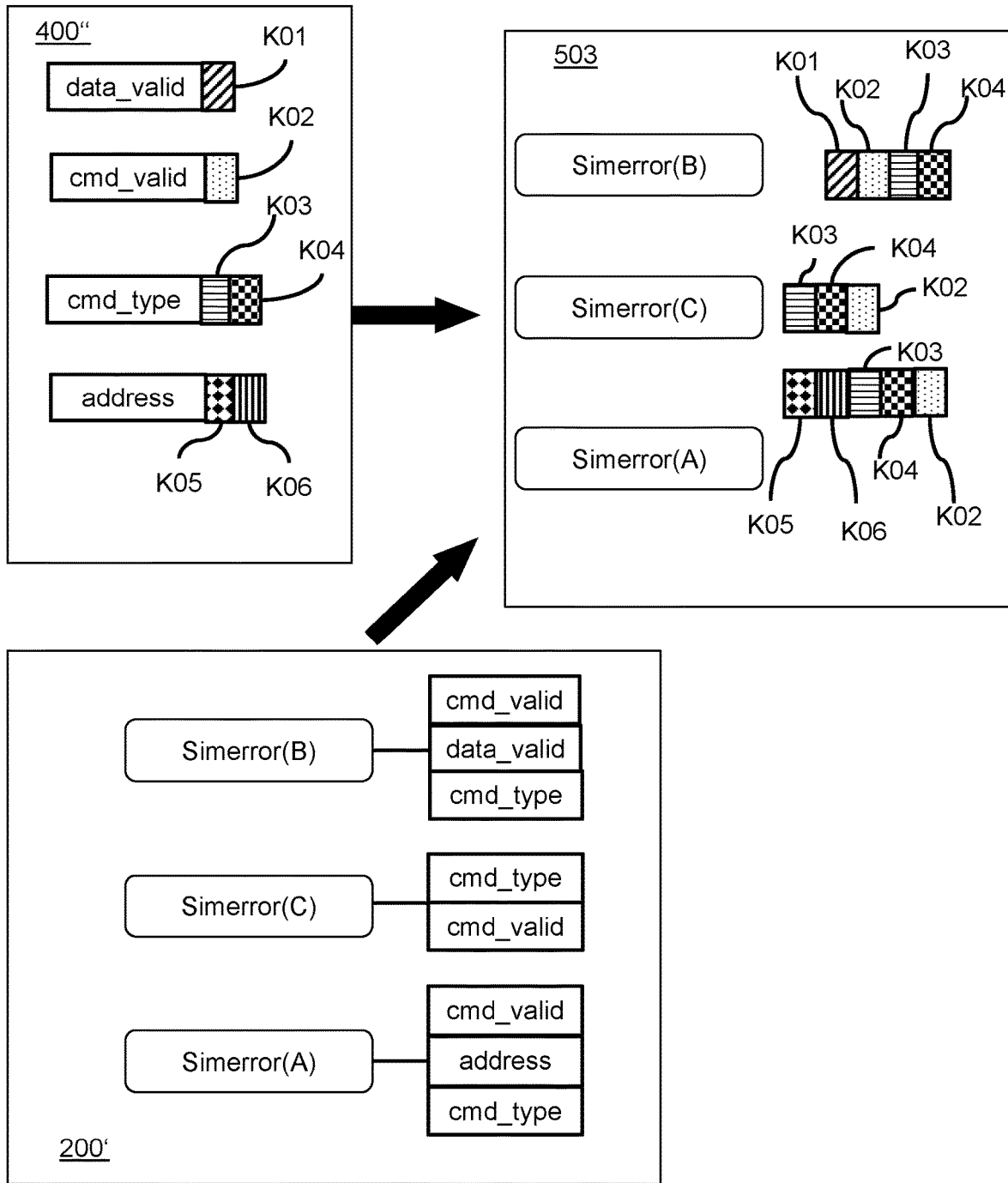
FIG. 15 shows the cross product of combining data flow database with attributed values with the control flow database in accordance with an exemplary embodiment of the present invention.

FIG. 15 depicts the combination, or cross product, of the results of the dynamic analysis, i.e., the data flow database with attributed values 400", that is already described in FIGS. 9 and 10, with the result of the static analysis, that is the control flow database 200', i.e., the result of the process as depicted with regard to FIG. 14, under reference sign operation 200.

Operation 503 of this combination may be a checker database having the checkers with controlling attributes (or colors, or patterns or symbols, or abbreviated signal names).

This result is achieved by, for every checker in the control flow database, for each of its attached variables, looking up the variable in the data flow database, compare with reference sign operation 501 in FIG. 5. Next, the attributes attached to the variable in the data flow database may then be attached to the checker, i.e. the concerned simerror, compare with reference sign operation 502 in FIG. 5. Subsequently, the result may be established, i.e., a database where each checker may then have a list of attributes, e.g., colors, symbols, patterns, abbreviations, involved in the control flow of the checker.

For example, the variable address, in 400", may have the attributed values K05 and K06, further, simerror(A), in control flow database 200', may be recognized upon having checked address, cmd_type and cmd_valid. Then, in checker database, operation 503, simerror(A) may be associated with all the attributes of the concerned variables, that is attributes K05 and K06 resulting from the variable address, attributes K03 and K04 resulting from the variable cmd_type, and attribute K02 resulting from the variable cmd_valid.

The attribute lists for the simerrors simerror(B) and simerror(C) may be derived analogously.

Figure 16:
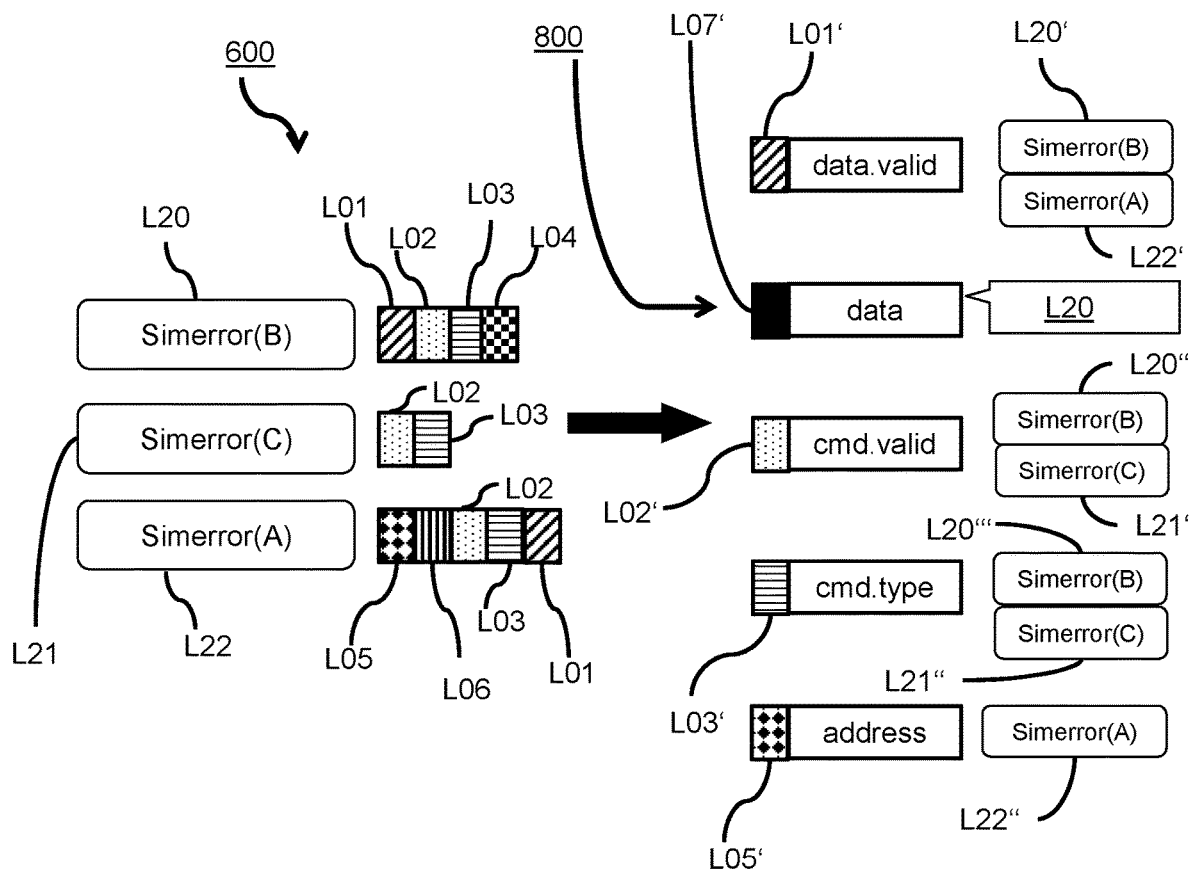
FIG. 16 shows a coverage report on the design interfaces in accordance with an exemplary embodiment of the present invention.

In an embodiment, FIG. 16 exemplarily depicts a coverage report on the design interfaces, referring to operations, associate checkers with signals 600, signal-checker(s) database 700, and coverage hole report 800, of FIG. 6.

For example, simerror(A), L22, that may be associated with attributes L05, L06, L02, L03 and L01, is related to a list of variables or signals data.valid L01', data L07', cmd.valid L02', cmd.type L03', and address L05'. As an intermediate result, simerror(A) is to be found to occur, when data.valid is tested and cmd.type is tested and address is tested. The skilled person, upon reading the above, will understand how to proceed with the simerrors simerror(B) and simerror(C). As an intermediate result, behind each variable that had been tested or covered at least once during verification, the name of the related error, e.g. simerror(A), is listed. However, in this example, behind the variable or signal "data" L07', there is no simerror mentioned L20. This means, that in the verification code, the signal "data" has never checked in the test run, although the check may be defined in the verification code. Such an information can be gained only by performing a combination of a static code analysis and a dynamic data analysis as described herein.

As a result, the evaluation exemplarily depicted in FIG. 16, illustrates how an indication as to whether the verification code covers all signals or not can be gathered.

Figure 17:
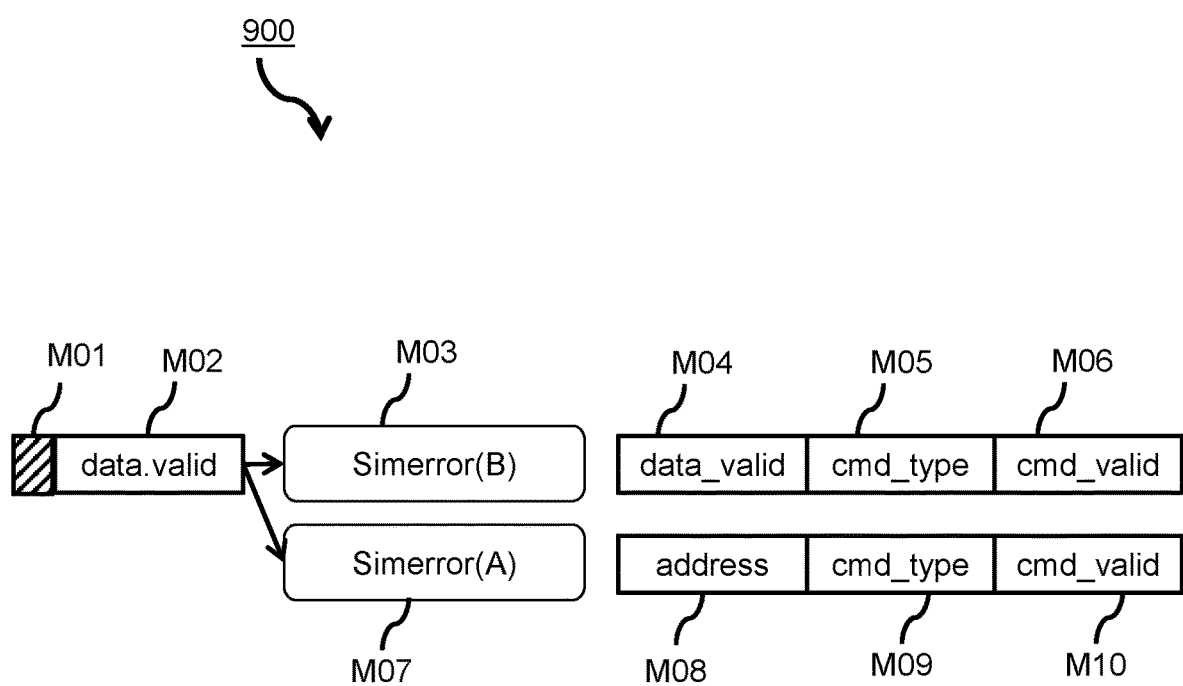
FIG. 17 shows a further coverage report on design interfaces in accordance with an exemplary embodiment of the present invention.

In FIG. 17, a second coverage report on design interfaces is exemplarily depicted. The first report as already shown creates a list of interface signals along with attached checkers. This means that interface signals without attached checkers are not checked and considered to be a coverage hole.

In accordance with operation 900 of FIG. 6, each checker may be accompanied by the checker's details, for example, based on the signal "data.valid" M02, having attribute M01, simerror(B) M03, might be accompanied by the checked variables data_valid M04, cmd_type M05, cmd_valid M06, whereas simerror(A) M07, might be accompanied by variable address M08, cmd_type M09, and cmd_valid M10.

Thus, error messages can be prepared in a database, based on appropriate keys that may be built by splitting up the nouns of messages into keys. The influencing control variables may be associated to appropriate checkers. The result showing the concerned attributes may be a basis for a manual review of checkers.

Figure 18:
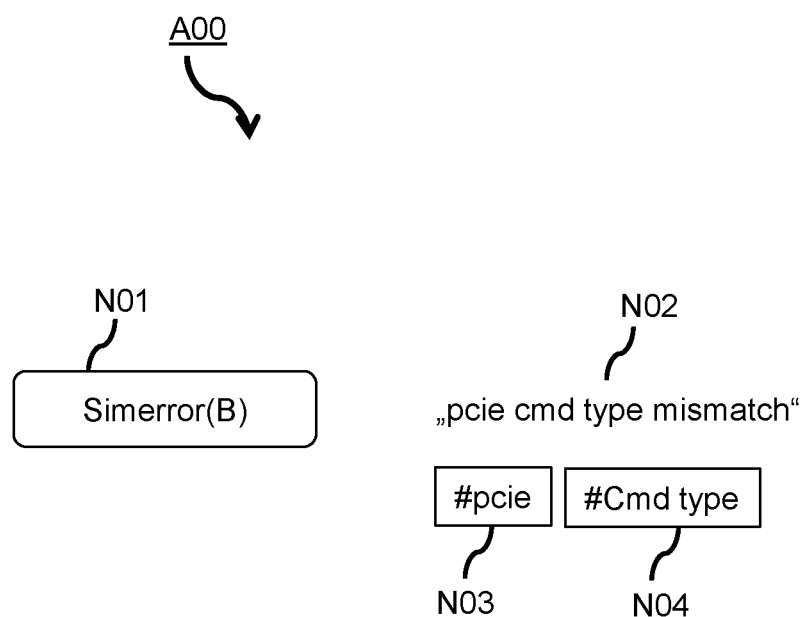
FIG. 18 shows a checker key word extraction in accordance with an exemplary embodiment of the present invention.

An example of a checker key word extraction, as mentioned before under reference sign A00 in FIG. 7, is depicted in FIG. 18: Based on each checker consisting of a simerror that produces an appropriate error message, said error message may be parsed, compare operation A01 in FIG. 7, using lexical analysis to extract the nouns which may then be used as keys. As an example, simerror(B), N01, might produce an error message "pcie cmd type mismatch", N02. This expression might be parsed into the nouns, converted to be keys "#pcie", N03, and "#Cmd type", N04.

Figure 19:
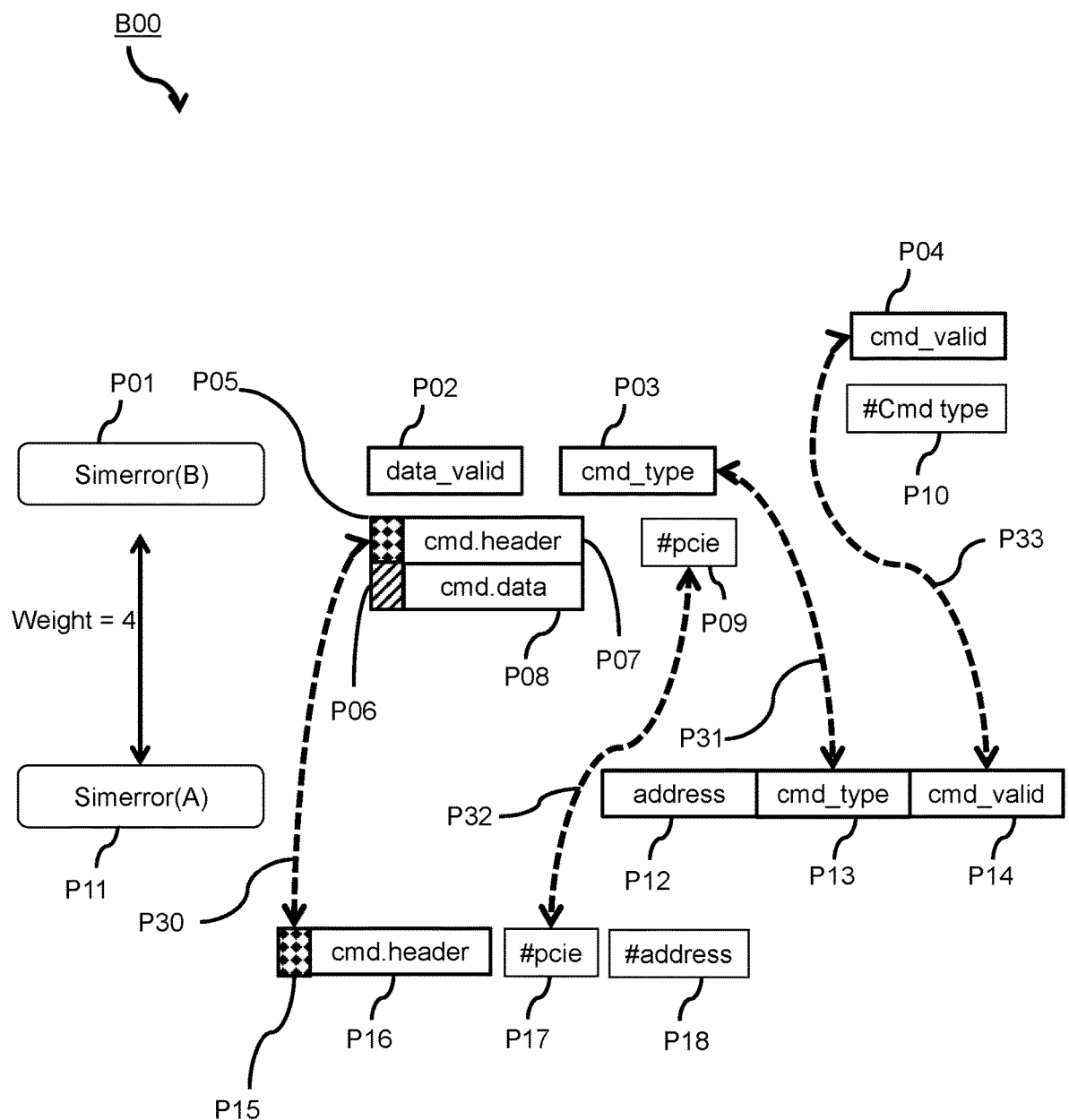
FIG. 19 shows a creation of a checker dependency network in accordance with an exemplary embodiment of the present invention.

FIG. 19 exemplarily depicts a creation of a checker dependency network as already mentioned under reference signs B00, connect checkers, and B01, collect and weight attributes, in FIG. 7.

A simerror(B), P01, might be associated with data_valid, P02, cmd_type, P03, cmd_valid, P04, cmd.header, provided with attributed P05, cmd.data, P08, provided with attribute P06, and the keys "#pcie", P09, and "#Cmd type", P10.

A simerror(A), P11, might be associated with different variables, signals and keys.

However, in this example, simerror(A) and simerror(B) may have the same cmd.header, P07 identical to P16, provided with the same attribute P05 identical to P15. Further, both simerrors may have an identical variable cmd_type, P03 and P13, an identical key "#pcie", P09 and P17 and a further identical variable cmd_valid, P04 and P14. The above correspondences are visualized by dashed double-arrow arcs P30, P31, P32 and P33. Thus, in this example, there are four conformances in all the attributes of simerror(A) and simerror(B). As a result, the logical connection between simerror(A) and simerror(B) may get the value of, in this example, weight=4.

The operations of calculating the weight are set forth, above, concerning FIG. 7, operation B00, connect checkers, when discussing logical connections.

Figure 20:
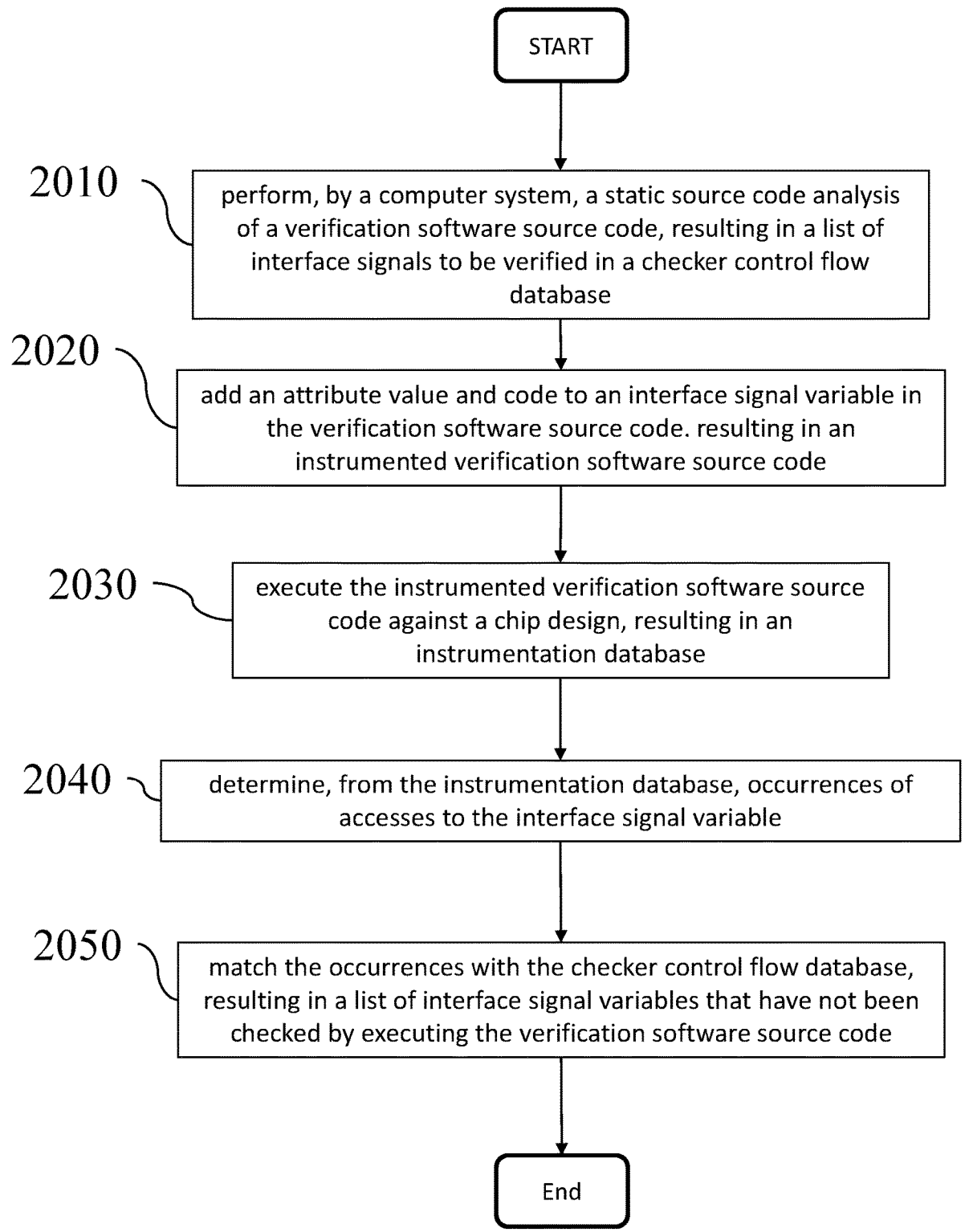
FIG. 20 shows a flow chart according to an embodiment of the present invention.

Referring to FIG. 20, in an exemplary embodiment, the present invention is configured to perform an operation 2010 of performing a static source code analysis of a verification software source code, resulting in a list of interface signals to be verified in a checker control flow database, operation 2020 of instrumenting the verification software source code by adding an attribute value and code to a variable representing an interface signal variable, operation 2030 of running, based on an executable the instrumenting the verification software, a verification against chip design, resulting in an instrumentation database, operation 2040 of determining, from the instrumentation database, all occurrences of accesses to the interface signal variable, operation 2050 of matching all of the occurrences with the checker control flow database, thus obtaining a list of interface signal variables that have not been checked in running the verification.

The terminology used herein is for the purpose of escribing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, operations, operations, elements, and/or components, but do not preclude the presence or addition of one or more other features, integers, operations, operations, elements, components, and/or groups thereof.

The corresponding structures, materials, acts, and equivalents of all means or operation plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A computer implemented method comprising:
   performing, by a computer system, a static source code analysis of a verification software source code, resulting in a list of interface signals to be verified in a checker control flow database;
   adding an attribute value and code to an interface signal variable in the verification software source code, resulting in an instrumented verification software source code;
   executing the instrumented verification software source code against a chip design, resulting in an instrumentation database;
   determining, from the instrumentation database, occurrences of accesses to the interface signal variable;
   analyzing the checker control flow database and creating a logical connection to a second checker control flow database based on a second attribute value in the second database;
   generating a signal checker coverage report linking hardware signals for the chip design, control variables associated with the hardware signals, and a coverage hole report,
   wherein the coverage hole report indicates whether the interface signal variable has not been issued by the chip design under test, according to the verification software source code;
   matching the occurrences with the checker control flow database, resulting in a list of interface signal variables that have not been checked by executing the verification software source code; and
   outputting a checker coverage report.

2. The method of claim 1, wherein the attribute value is at least one of a color, a pictogram, a pattern, an abbreviation of a variable, an abbreviation of a signal name, a binary hash value, a binary hash variable, and a binary hash signal name.

3. The method of claim 1, wherein the verification software source code is written in a high level programming language.

4. The method of claim 1 further comprising, creating, by the computer system, a control flow graph of the verification software source code.

5. The method of claim 1, further comprising finding all verification end nodes in the verification software source code.

6. The method of claim 1, further comprising performing a backward analysis on each verification end node resulting in signal variables that are checked before a control flow reaches the each verification end node.

7. The method of claim 1, further comprising determining interface signal variables from which a verification end node depends.

8. The method of claim 1, wherein the attribute value represents the interface signal variable.

9. The method of claim 1, further comprising writing the attribute value into the instrumentation database in response to referencing the interface signal variable.

10. The method of claim 1, further comprising collecting interface variables and attribute values representing respective interface signal variables.

11. The method of claim 1, wherein the matching comprises matching attribute values representing respective interface signals from a trace file with entries of the checker control flow database.

12. The method of claim 1, further comprising obtaining a list of verification end nodes with respective attribute values representing respective interface signals, from a trace file and, based on the list of verification end nodes, building a checker database.

13. The method of claim 1, wherein the matching comprises, for each interface signal variable from the checker control flow database and each interface signal variable attribute value:
retrieving the each interface signal variable attribute value from a checker database;
relating a respective verification end node associated respectively to the each interface signal variable attribute value to each interface signal; and
determining interface signals with which no verification end node is associated.

14. The method of claim 1, further comprising outputting a coverage hole report.

15. The method of claim 1, further comprising outputting a signal.

16. The method of claim 1,
wherein the performing further comprises:
extracting names of verification end nodes from a checker database;
connecting the verification end nodes;
collecting weight attributes;
wherein the analyzing further comprises:
associating the weight attributes to the connected verification end nodes, resulting in a checker dependency network; and wherein the outputting further comprises:
outputting a visual report of grouping the checker control flow database and the second checker control flow database based on the weight attributes.

17. The method of claim 1, further comprising:
putting the interface signal variable into a wrapper class, wherein the attribute value is added beneath the interface signal variable.

18. The method of claim 1, further comprising:
creating a checker dependency network by extracting names of verification end nodes from a checker database;
connecting the verification end nodes;
collecting weight attributes;
associating the weight attributes to the connections; and
visually reporting of grouping checkers based on the weight attributes.

19. The method of claim 1, further comprising:
tracing a function call of an instrumented comparison method, the instrumented comparison method overwriting an original comparison method and having added a write statement for a trace output,
wherein the second attribute may be added to an attribute list of assigned attributed variables; and
instrumenting the verification software source by inserting one or more logical operations between the attributed variables.

* * * * *